United States Patent
Prasantanakorn et al.

(10) Patent No.: US 12,438,439 B2
(45) Date of Patent: Oct. 7, 2025

(54) COMMON MODE NOISE CANCELLATION FOR LLC RESONANT CONVERTERS

(71) Applicant: Apple Inc., Cupertino, CA (US)

(72) Inventors: Chanwit Prasantanakorn, Santa Clara, CA (US); Bharat K Patel, San Martin, CA (US)

(73) Assignee: Apple Inc., Cupertino, CA (US)

( * ) Notice: Subject to any disclaimer, the term of this patent is extended or adjusted under 35 U.S.C. 154(b) by 361 days.

(21) Appl. No.: 18/162,196

(22) Filed: Jan. 31, 2023

(65) Prior Publication Data

US 2024/0258905 A1    Aug. 1, 2024

(51) Int. Cl.
| | |
|---|---|
| *H02M 1/12* | (2006.01) |
| *H02M 1/42* | (2007.01) |
| *H02M 3/00* | (2006.01) |
| *H02M 3/335* | (2006.01) |
| *H02M 7/04* | (2006.01) |

(52) U.S. Cl.
CPC ......... *H02M 1/123* (2021.05); *H02M 1/4208* (2013.01); *H02M 3/01* (2021.05); *H02M 3/33571* (2021.05); *H02M 7/04* (2013.01); *H02M 1/4225* (2013.01); *H02M 1/4241* (2013.01)

(58) Field of Classification Search
CPC ............... H02M 1/123; H02M 1/4225; H02M 1/4241; H02M 3/01; H02M 3/33571
See application file for complete search history.

(56) References Cited

U.S. PATENT DOCUMENTS

| | | | |
|---|---|---|---|
| 6,490,181 B1 * | 12/2002 | Liu | H02M 1/12 363/40 |
| 6,930,893 B2 | 8/2005 | Vinciarelli | |
| 8,670,250 B2 * | 3/2014 | Fu | H02M 3/28 363/39 |
| 10,084,388 B2 | 9/2018 | Takahashi et al. | |
| 10,243,453 B1 | 3/2019 | Andres et al. | |

(Continued)

OTHER PUBLICATIONS

Y. Yang, D. Huang, F.C. Lee, and Q. Li, "Transformer shielding technique for common mode noise reduction in solated converters", IEEE ECCE, 2013.

(Continued)

*Primary Examiner* — Gary A Nash
(74) *Attorney, Agent, or Firm* — FLETCHER YODER PC

(57) ABSTRACT

A power converter can include a switching bridge having two input terminals that receive an input voltage and a switch node coupled to a primary winding of a transformer; at least one rectifier device coupled between a secondary winding of the transformer and an output of the power converter; and a common mode noise compensation capacitor. A first terminal of the common mode noise compensation capacitor can be coupled to a connection between the secondary winding of the transformer and the at least one rectifier device, and a second terminal of the common mode noise compensation capacitor can be coupled to one of the two input terminals. The common mode noise compensation capacitor can be coupled to an energized or a grounded input terminal. The common mode noise compensation capacitance can be selected to be equal to the turns ratio of the transformer times the parasitic capacitance of the transformer.

31 Claims, 11 Drawing Sheets

(56) References Cited

U.S. PATENT DOCUMENTS

| | | | |
|---|---|---|---|
| 10,320,279 | B2 | 6/2019 | Cheng et al. |
| 10,554,122 | B1* | 2/2020 | Xiong ................... H02M 1/44 |
| 2020/0076315 | A1* | 3/2020 | Peng ................ H02M 3/33576 |
| 2021/0313876 | A1 | 10/2021 | Kumar et al. |
| 2022/0029548 | A1 | 1/2022 | Jeong et al. |
| 2022/0085725 | A1 | 3/2022 | Kolar et al. |
| 2022/0255442 | A1 | 8/2022 | Morrison et al. |
| 2022/0270816 | A1 | 8/2022 | Takeda et al. |

OTHER PUBLICATIONS

Y. Yang, D. Huang, F.C. Lee, and Q. Li, "Analysis and reduction of common mode EMI noise for resonant converters", IEEE APEC, 2014.

C. Fei, Y. Yang, Q. Li, and F.C. Lee, "Shielding Technique for Planar Matrix Transformers to Suppress Common-Mode EMI Noise and Improve Efficiency", IEEE Trans on Industrial Electronics, Feb. 2018, pp. 1263-1272.

Y.P. Chan, M.H. Pong , N.K. Poon, and C.P. Liu, "Common-Mode Noise Cancellation by an Antiphase Winding in Multilayer Isolated Planar Transformer", IEEE Trans on EMC, Feb. 2014, pp. 67-73.

* cited by examiner

COMMON MODE NOISE CANCELLATION FOR LLC RESONANT CONVERTERS

BACKGROUND

Switching power supplies are used in a wide variety of applications. In some applications, it may be desirable to reduce electromagnetic interference ("EMI" or, colloquially, "noise") associated with switching power supplies to comply with design and performance objectives, regulatory requirements, etc. Noise reduction can rely on modifications to the operation and/or the construction of a switching power supply. In transformer-based switching converters, such as LLC resonant converters, common mode noise may be associated with rapid voltage transitions (high dV/dt) and parasitic capacitance of a transformer. In such applications, two construction-based noise reduction techniques that have been used in the past include using shielding layers within the transformer and/or noise cancellation windings.

Shielding layers inside the transformer can be used to reduce common-mode noise. Examples of such arrangements include:

Y. Yang, D. Huang, F. C. Lee, and Q. Li, "Transformer shielding technique for common mode noise reduction in isolated converters", IEEE ECCE, 2013.

Y. Yang, D. Huang, F. C. Lee, and Q. Li, "Analysis and reduction of common mode EMI noise for resonant converters", IEEE APEC, 2014.

C. Fei, Y. Yang, Q. Li, and F. C. Lee, "Shielding Technique for Planar Matrix Transformers to Suppress Common-Mode EMINoise and Improve Efficiency", IEEE Trans on Industrial Electronics, February 2018, pp. 1263-1272.

The shielding layer inside the transformer can incur eddy current loss, which can reduce operating efficiency. With printed circuit board ("PCB")-based planar transformers (as opposed to wire-wound transformers), the shielding layer can also increase the number of PCB layers and the overall thickness of the transformer, which may be undesirable in some applications, particularly those with particularly strict space requirements.

Noise cancellation windings can also decrease common-mode noise. One example of such an arrangement is Y. P. Chan, M. H. Pong, N. K. Poon, and C. P. Liu, "Common-Mode Noise Cancellation by an Antiphase Winding in Multilayer Isolated Planar Transformer", IEEE Trans on EMC, February 2014, pp 67-73. The technique is easily implemented in a wire-wound transformer. With PCB planar transformers, it requires an additional PCB layer, which can have a similar drawback to the shielding layer construction described above.

SUMMARY

Thus, it would be desirable to provide arrangements for reducing common mode noise in transformer-based switching converters, such as LLC resonant converters. Such techniques are described herein. To briefly summarize, a capacitor between the primary and secondary circuits can create an equal current flowing in the opposite direction as the common mode noise current, thereby offsetting or reducing the common-mode current. Advantageously, this technique can be applied to wire-wound or PCB-based planar transformers and can overcome deficiencies of the prior art techniques described above.

A power converter can include a switching bridge having two input terminals configured to receive an input voltage and a switch node coupled to a primary winding of a transformer; at least one rectifier device coupled between a secondary winding of the transformer and an output of the power converter; and a common mode noise compensation capacitor, a first terminal of the common mode noise compensation capacitor being coupled to a connection between the secondary winding of the transformer and the at least one rectifier device, and a second terminal of the common mode noise compensation capacitor being coupled to one of the two input terminals. The common mode noise compensation capacitor can be coupled to an energized input terminal. The common mode noise compensation capacitor can be coupled to a grounded input terminal. A capacitance of the common mode noise compensation capacitor can be selected to be equal to the turns ratio of the transformer times the parasitic capacitance of the transformer. The power converter can be an LLC resonant converter and can further include a resonant capacitor coupled to the primary winding of the transformer. The resonant capacitor can be coupled in series with the primary winding. The power converter can further include a capacitor coupled between an input ground and an output ground of the power converter.

A power supply can include an input power factor correction stage configured to receive an AC input voltage and produce a DC an intermediate DC bus voltage; and a DC-DC conversion stage configured to receive the intermediate DC bus voltage and produce a DC output voltage. The DC-DC conversion stage can further include: a switching bridge having two input terminals configured to receive an input voltage and a switch node coupled to a primary winding of a transformer; at least one rectifier device coupled between a secondary winding of the transformer and an output of the power converter; and a common mode noise compensation capacitor, a first terminal of the common mode noise compensation capacitor being coupled to a connection between the secondary winding of the transformer and the at least one rectifier device, and a second terminal of the common mode noise compensation capacitor being coupled to one of the two input terminals. The common mode noise compensation capacitor can be coupled to an energized input terminal. The common mode noise compensation capacitor can be coupled to a grounded input terminal. A capacitance of the common mode noise compensation capacitor can be selected to be equal to the turns ratio of the transformer times the parasitic capacitance of the transformer. The power converter can be an LLC resonant converter and can further include a resonant capacitor coupled to the primary winding of the transformer. The power supply can further include a capacitor coupled between an input ground and an output ground of the power converter.

A power supply can include an input power factor correction stage configured to receive an AC input voltage and produce a DC an intermediate DC bus voltage; and a DC-DC conversion stage having first and second input terminals that receive the intermediate DC bus voltage and one or more switching devices operable to produce a DC output voltage. The DC-DC conversion stage can further include a transformer having a primary winding and a secondary winding; and a common mode noise compensation capacitor, a first terminal of the common mode noise compensation capacitor being coupled to the secondary winding of the transformer, and a second terminal of the common mode noise compensation capacitor being coupled to one of the two input terminals. The input power factor correction can further include a rectifier; one or more common mode choke coils coupled between the AC input voltage and a rectifier; one or more filter capacitors coupled across the AC input voltage; a boost converter coupled to an output of the rectifier and operable to provide the intermediate DC bus voltage. The common mode noise compensation capacitor can be coupled to an energized input terminal. The common mode noise compensation capacitor can be coupled to a grounded input terminal. A capacitance of the common mode noise compensation capacitor can be selected to be equal to the turns ratio of the transformer times the parasitic capacitance of the transformer. The power converter can be an LLC resonant converter and can further include a resonant capacitor coupled in series with the primary winding of the transformer. The power supply can further include a capacitor coupled between an input ground and an output ground of the power converter.

DETAILED DESCRIPTION

Figure 1:
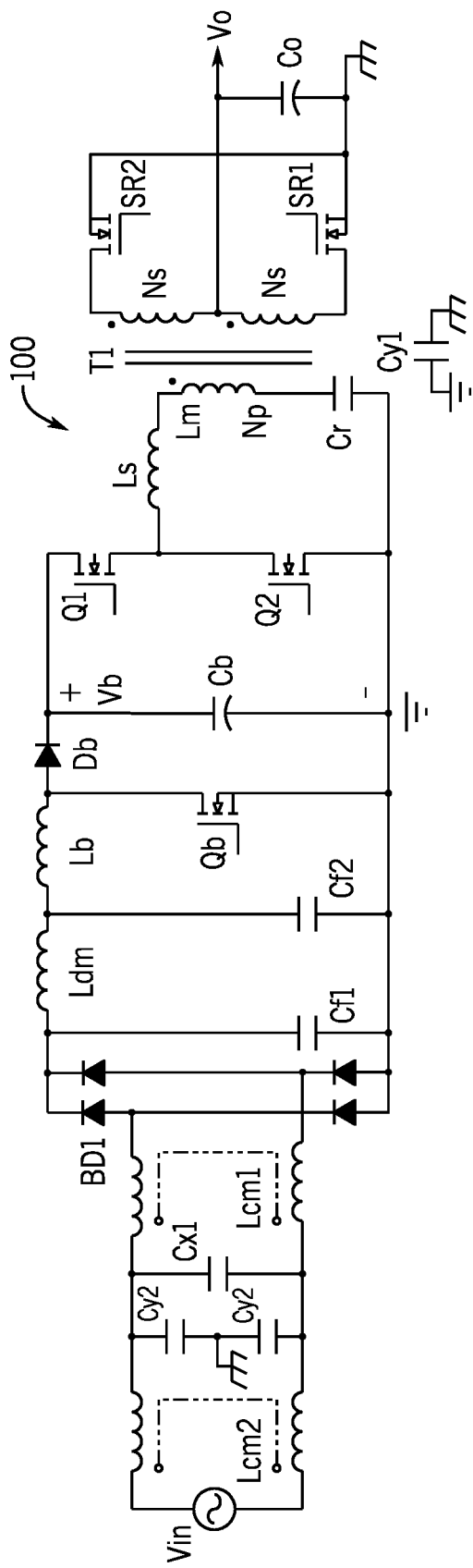
FIG. 1 illustrates a power supply including a power factor correction circuit and an LLC resonant converter.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth to provide a thorough understanding of the implementations described herein. In other instances, methods, procedures, and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

FIG. 1 illustrates a power supply 100 including a power factor correction circuit and an LLC resonant converter. As a general rule, AC-DC power supply units (PSUs) with a power rating above 75 W will include power factor correction circuitry. Power supply 100 uses a 2-stage topology comprising a power factor correction (PFC) stage and an isolated DC-DC converter (D2D). The PFC stage includes inductor Lb, switch Qb, and diode Db, functioning essentially as a boost converter. The PFC stage receives the AC input voltage Vin after noise filtering by the choke and capacitor arrangement including chokes Lcm1/Lcm2 and capacitors Cx1/Cy2 and after rectification by diodes BD1. Input filter capacitors Cf1 and Cf2 may also be provided, along with a differential mode choke Ldm. The PFC stage converts the (rectified) input AC voltage to a fixed DC voltage Vb (e.g., 400V DC for a typical 100-240V AC input) that appears across a bus supported by bulk capacitor Cb. The PFC stage also controls the input current waveform to follow the input AC voltage to achieve a relatively high power factor. Although the PFC stage can be typically implemented with a boost converter, other circuit configurations could also be used.

The isolated D2D stage (including the half bridge made up of switches Q1/Q2, transformer T1, resonant capacitor Cr, and synchronous rectifier devices SR1/SR2) converts the high-voltage output the PFC stage (Vb) to a low-voltage output Vo suitable for various electronic circuits. The illustrated D2D stage is an LLC resonant converter, but other converter topologies, such as flyback converters, half-bridge converters, full-bridge converters, etc. could also be used. The remainder of this disclosure primarily describes common mode noise reduction in the context of an LLC resonant converter, although the principles may be applied to other converter types.

Each of the switching devices described above (and in the following figures) are depicted as metal oxide semiconductor field effect transistors (MOSFETs). However, depending on the requirements of a particular implementation, other semiconductor switching devices could be used, such as insulated gate bipolar transistors (IGBTs), silicon controlled rectifiers (SCRs), thyristors, etc. Additionally, the input rectifier is illustrated as a passive rectifier made up of bridge diodes BD1, and boost diode Db is also illustrated as a passive device. However, in each case, an active rectifier implemented using active switching devices could alternatively be provided. Similarly, an active/synchronous rectifier is depicted on the secondary side of transformer T1, but a passive rectifier using diodes could alternatively be provided. In general, converters using transformer T1 in a step down configuration result in relatively lower currents on the primary side, making the use of a passive rectifier and the associated losses tolerable in many applications, while the relatively higher currents on the primary side may result in a synchronous rectifier having significant efficiency advantages.

Additionally, the above-described semiconductor devices may be implemented using any suitable semiconductor technology, including, but not limited to, silicon (Si), silicon carbide (SiC), gallium nitride (GaN), etc. Finally, not all the illustrated components need be discrete components. For example, the series inductance Ls of the LLC resonant converter may be a discrete inductor and/or a leakage inductance of transformer T1 and/or a parasitic inductance associated with the packaging and connection of switching devices Q1/Q2. That is, the inductance required to provide the desired operation can be provided by any combination of a discrete inductor and/or a leakage or parasitic inductance.

Figure 2:
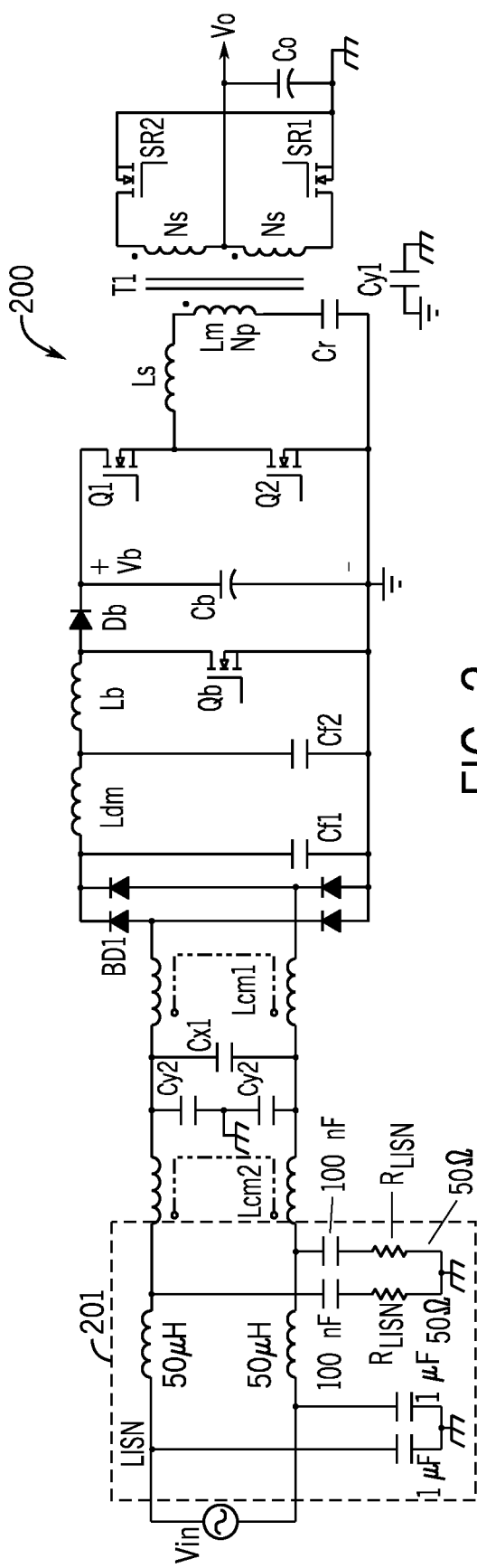
FIG. 2 illustrates an electromagnetic interference (EMI) test setup for an LLC resonant converter power supply.

As mentioned above, PSUs may be required to comply with various regulatory requirements, including requirements relating to electromagnetic interference ("EMI"). FIG. 2 depicts an exemplary conducted EMI test setup for an LLC resonant power supply 200. In the illustrated configuration, the input of power supply 200 can be connected to a line impedance stabilization network (LISN) 201 to measure conducted EMI. The output ground of power supply 200 can be connected to earth ground during the conducted EMI test. Conducted EMI testing techniques are known to those skilled in the art, and the details of such techniques will not be repeated here for sake of brevity. In general, the conducted EMI has two components: a differential-mode noise and a common-mode noise.

Figure 3:
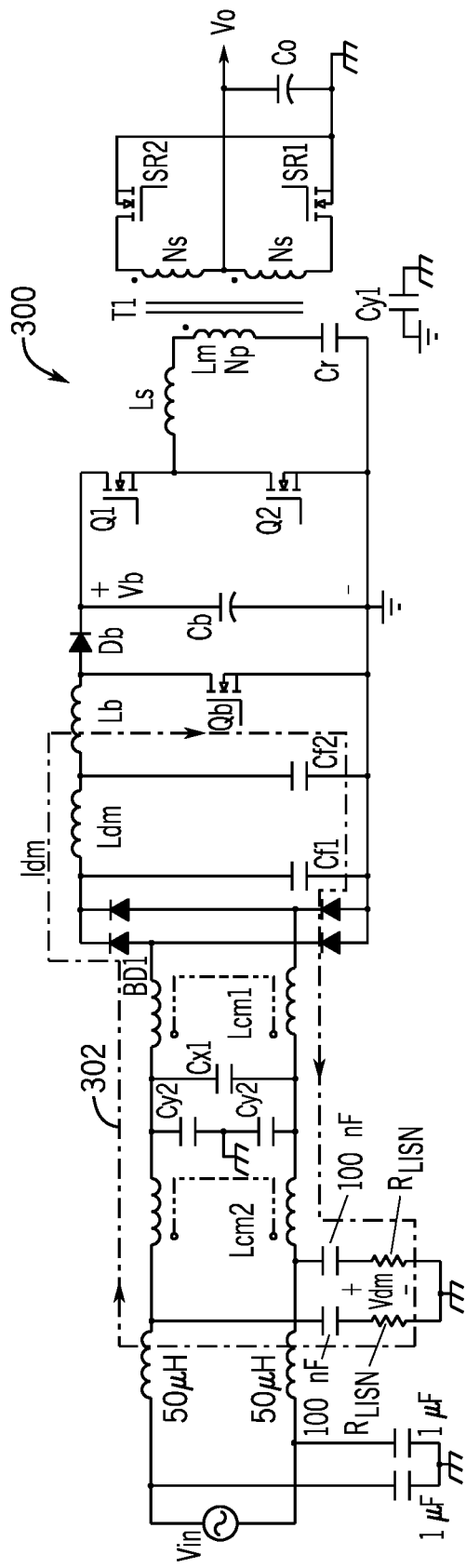
FIG. 3 illustrates differential mode noise in an LLC resonant converter power supply.

FIG. 3 illustrates differential mode noise 302 in an LLC resonant converter power supply 300. Generally, input ripple current from the PFC stage can generate the differential-mode noise. The differential-mode noise can be relatively easily mitigated by increasing the capacitance of an X-capacitor, Cx1, on the AC input side, providing one or more filter capacitors Cf1, Cf2 after the rectifier bridge, and/or by providing a differential-mode filter inductor, Ldm.

Figure 4:
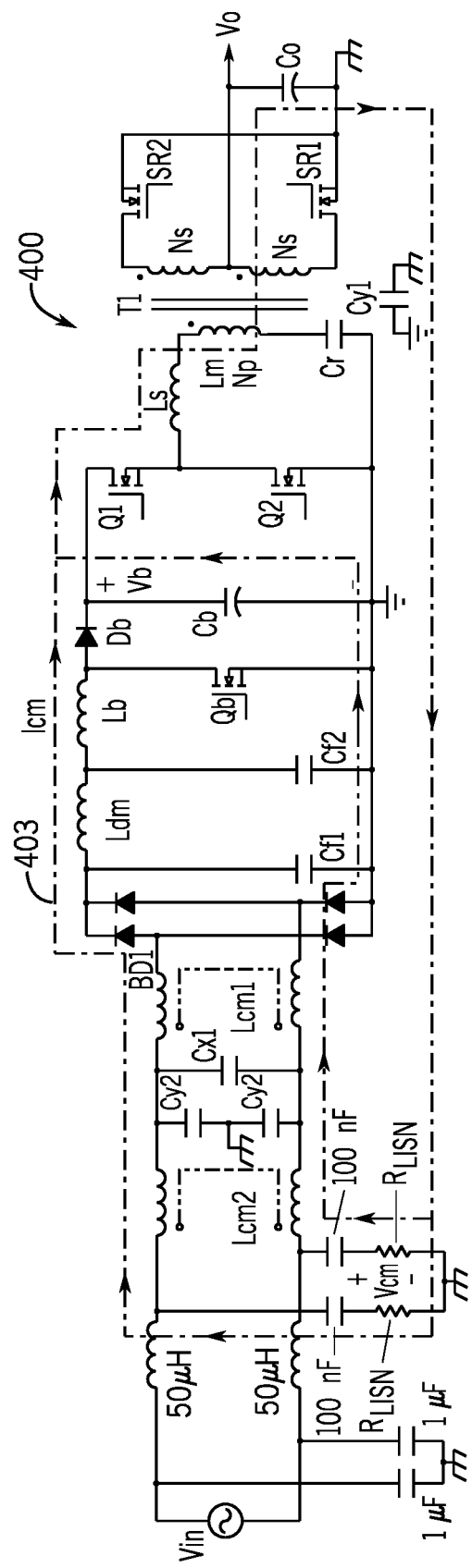
FIG. 4 illustrates common mode noise in an LLC resonant converter power supply.

Conversely, the LLC stage can generate the common-mode EMI. FIG. 4 illustrates common mode noise 403 in an LLC resonant converter power supply 400. The common-mode noise can be generated by the currents flowing across the isolation barrier in the isolated DC-to-DC converter. The common-mode current is proportional to the voltage transition rate (dv/dt) at each side of the transformer and the parasitic capacitance across the isolation barrier. This common-mode noise can thus be harder to mitigate because it depends on the parasitic capacitance of the LLC transformer. The common-mode noise can be reduced by increasing the common-mode filter inductor Lcm1/Lcm2, providing or increasing the value of a Y-capacitor Cy1 between the primary and secondary circuit grounds, and/or by providing or increasing the value of a Y-capacitor Cy2 between AC input lines and the earth ground. In at least some embodiments, increasing the capacitor values may be preferred over increasing the inductor values because larger inductors may have higher conduction losses. However, user comfort and/or safety considerations can impose a maximum limit of the total Y-capacitor value to limit leakage current that can be felt by a user while touching ungrounded metallic surfaces of the device. Thus, with the various noise filtering inductance and/or capacitance values being limited by various objectives and requirements of the respective applications, and with transformer construction techniques such as shielding and noise cancelling windings having their own drawbacks, further common mode noise techniques may be desirable for some applications.

Figure 5:
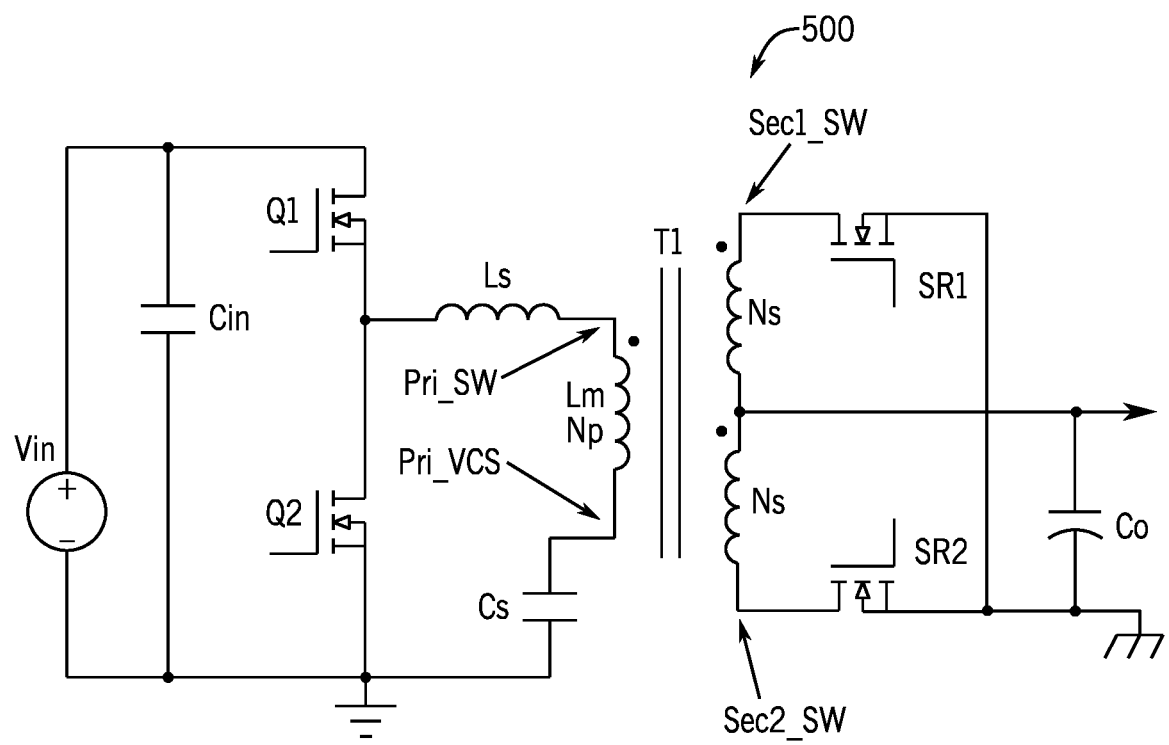
FIG. 5 illustrates certain relevant voltage of an LLC resonant converter power supply.

Before discussing such common mode noise reduction techniques, it is useful to define certain voltages of an exemplary LLC resonant converter. FIG. 5 illustrates certain relevant voltages of an LLC resonant converter 500. Four voltages at the transformer are labeled Pri_SW (the voltage at the terminal of the primary winding connected to the switch node of the half bridge), Pri_VCS (the voltage where the other terminal of the primary winding connects to resonant capacitor Cs), Sec1_SW (the voltage at one terminal of the secondary winding coupling to first synchronous rectifier device SR1), and Sec2_SW (the voltage at the other terminal of the secondary winding coupling to second synchronous rectifier device SR2. In operation, Pri_SW can be approximately a square wave with a large peak-to-peak amplitude corresponding to the input DC voltage of the LLC stage (e.g., 400V). Pri_VCS is approximately a sinusoidal voltage across the resonant capacitor Cs. Sec1_SW is approximately a square wave with a small amplitude (e.g., 24 Vpp), corresponding twice the output voltage. Sec2_SW is approximately a square wave that is an inverted waveform of Sec1_SW. The given voltage examples are examples typical of some power supply types, but other voltages may be used as appropriate for a given application.

Figure 6:
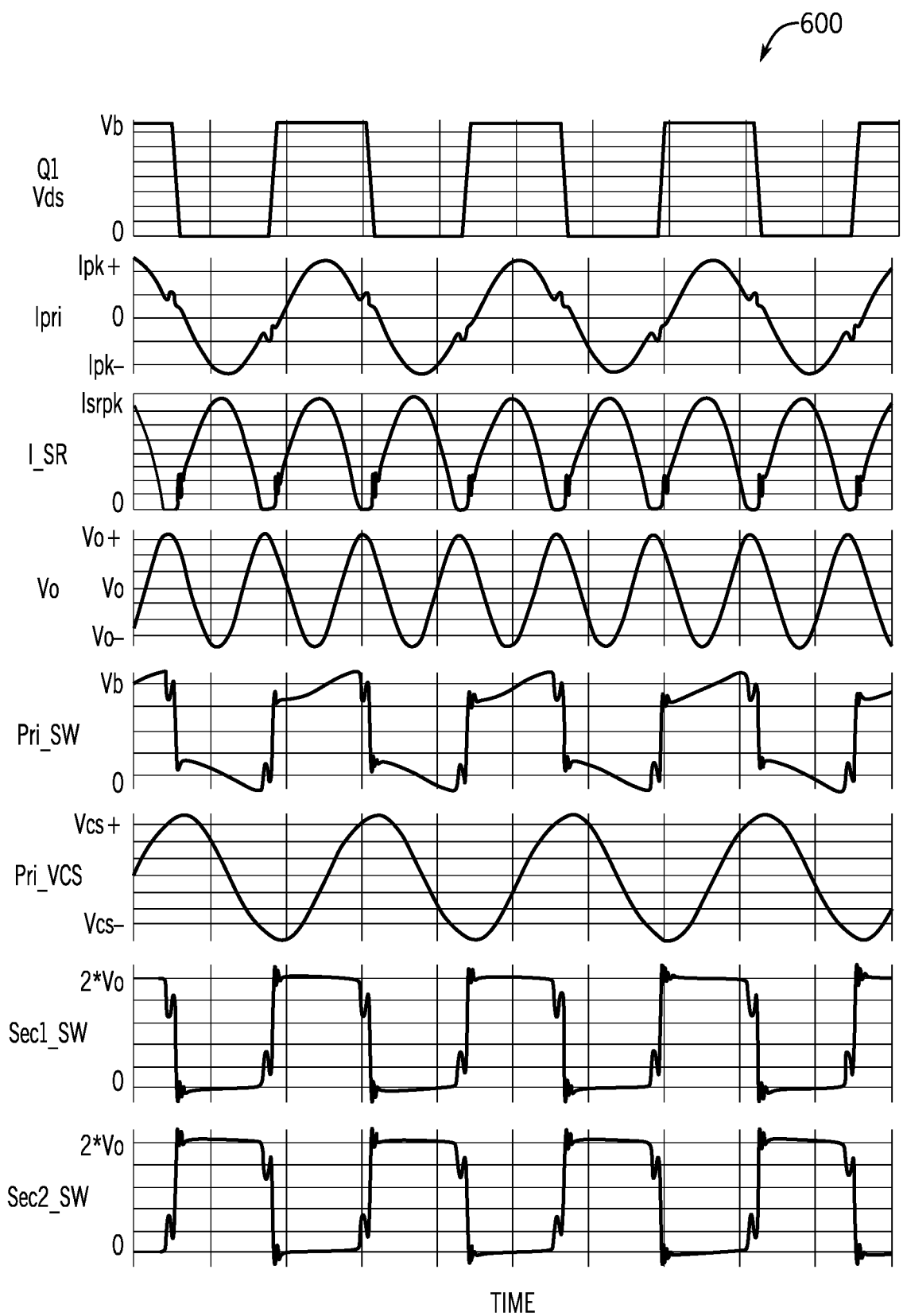
FIG. 6 illustrates various voltage and current waveforms of an LLC resonant converter power supply.

FIG. 6 illustrates a plot 600 showing various voltage and current waveforms of an LLC resonant converter power supply. Waveform Q1 Vds illustrates the drain-to-source voltage of half bridge high side switch Q1, thereby depicting the switching operation. In other words, the drain to source voltage of the switch is approximately equal to the DC bus voltage Vb when the switch is off (open) and zero when the switch is on (closed). Waveform Ipri illustrates the current through the primary winding of transformer T1, which is sinusoidal varying between positive and negative peak values Ipk+ and Ipk−. Waveform I_SR is the current through one of the synchronous rectifier switches, e.g., SR1. This current is a rectified sine wave varying between 0 and Isrpk. Waveform Vo is the output voltage, which has an average DC value Vo (e.g., 12V in the example discussed above) and has a sinusoidal ripple between Vo+ and Vo−. This AC ripple can be quite small relative to the magnitude of the DC output voltage.

The remaining waveforms of FIG. 6 are the voltages described above with respect to FIG. 5. Waveform Pri_SW is the voltage at the switch node of the half bridge/first terminal of the primary winding. As described above, this voltage is approximately a square wave varying between 0 and approximately the DC bus voltage Vb. Waveform Pri_VCS is a sinusoidal voltage with a DC offset varying between Vcs+ and Vcs−. Voltages Sec1_SW and Sec2_SW are 180 degree out of phase square waves with magnitude equal to twice the output voltage (i.e., 2*Vo).

Figure 7:
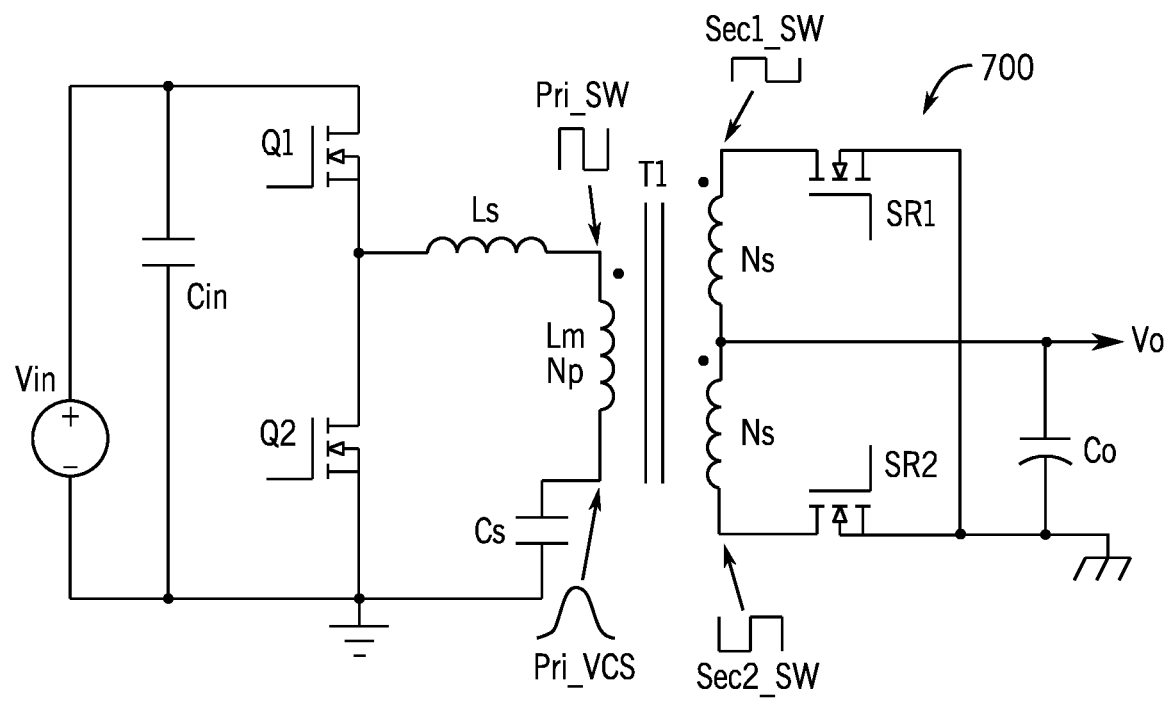
FIG. 7 illustrates simplified waveforms of an LLC resonant converter power supply.

FIG. 7 illustrates simplified waveforms of an LLC resonant converter 700. As described above voltage Pri_SW is a square wave having a relatively larger amplitude that corresponds to the DC bus voltage Vin. Pri_VCS is a sinusoidal voltage across resonant capacitor Cs. Sec1_SW and Sec2_SW are offset square waves having relatively smaller amplitudes that correspond to twice the output voltage Vo.

Figure 8:
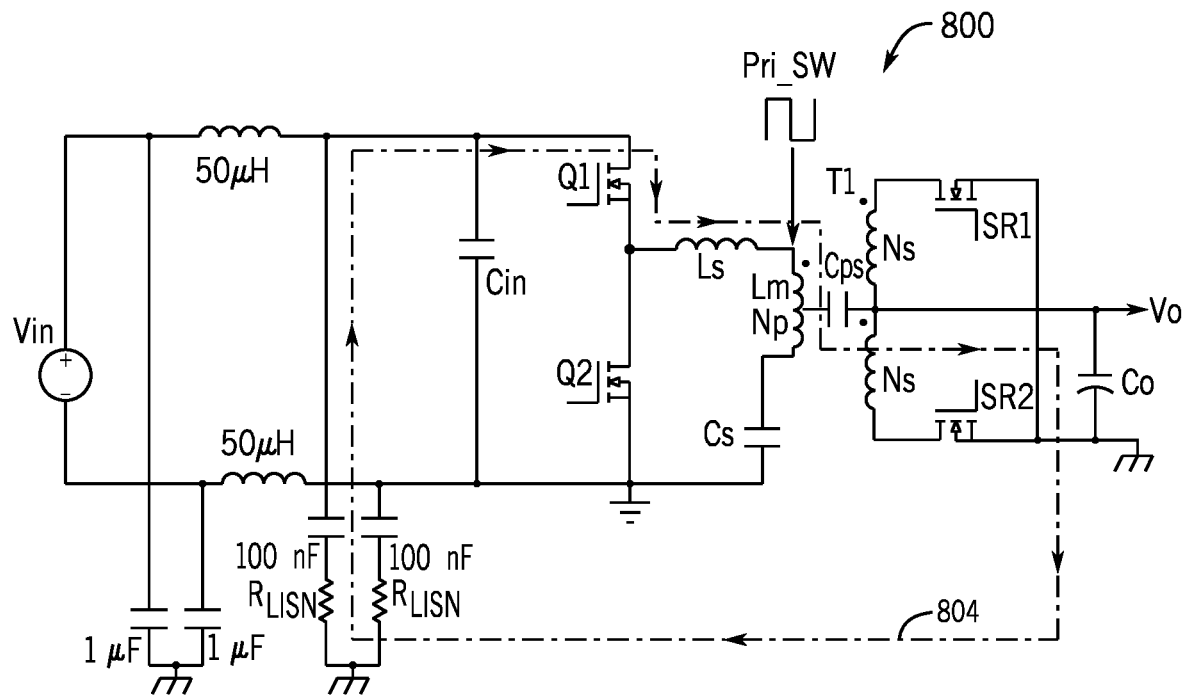
FIG. 8 illustrates common mode current generation in an LLC resonant converter power supply.

FIG. 8 illustrates common mode current 804 generation in an LLC resonant converter 800. The common-mode current is proportional to the voltage transition rate (dv/dt) at each side of the transformer and the parasitic capacitance (Cps) across the transformer. Note that FIG. 8 includes components of LISN 201 (discussed above with respect to FIG. 2) illustrating their position in the noise path of resonant converter 800. Additionally, the common mode noise can be generated as described above with respect to FIG. 4.

Figures 9, 10:
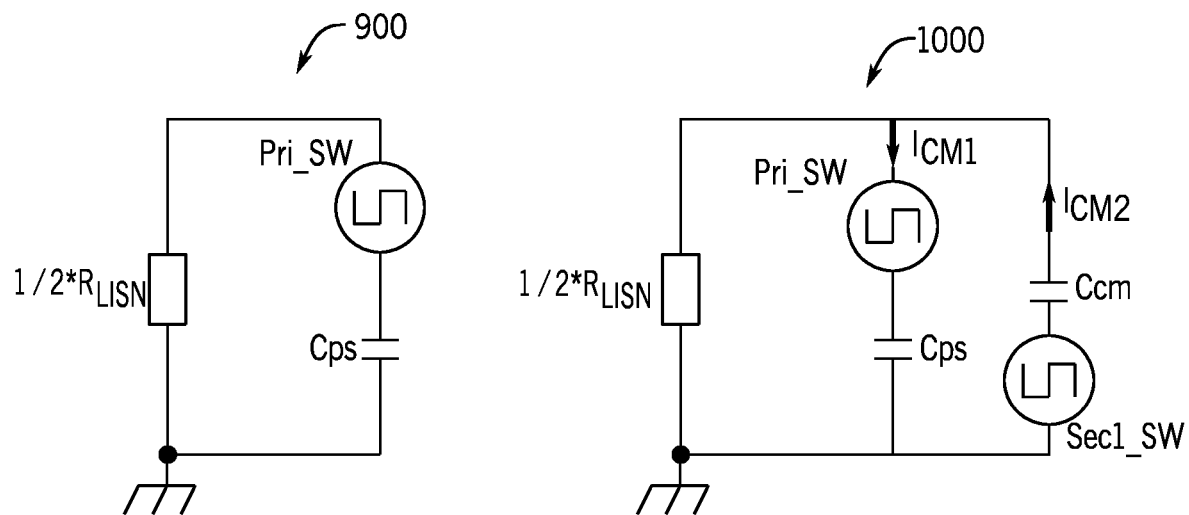
FIG. 9 illustrates a simplified common mode noise model for an LLC resonant converter power supply.
FIG. 10 illustrates a simplified common mode noise model for an LLC resonant converter power supply with common mode noise compensation.

FIG. 9 illustrates a simplified common mode noise model 900 for an LLC resonant converter power supply. Because it is a sinusoidal waveform (as compared to a square wave) voltage Pri_VCS has a relatively lower dv/dt. Thus, voltage Pri_VCS only minimally contributes to the common mode current and can thus be omitted from the simplified common mode noise model 900. Likewise, voltages Sec1_SW and Sec2_SW have equal but opposite waveforms, so the common mode currents flowing across Cps because of these voltages cancel each other. Thus, these secondary nodes do not contribute any common-mode noise and are omitted from the simplified common mode noise model 900. Finally, voltage Pri_SW has a high amplitude, 400 Vpp, with high dv/dt (by virtue of being a square wave). Thus, this voltage (and the parasitic capacitance Cps of transformer T1) are the main source of common mode noise in this circuit. Thus, the common mode noise can be modeled as a voltage source Pri_SW in series with parasitic capacitance Cps and an impedance (½*RLISN) associated with the line impedance stabilization network 201 (discussed above).

FIG. 10 illustrates a simplified common mode noise model 1000 for an LLC resonant converter power supply with common mode noise compensation capacitor Ccm. As discussed above with respect to FIG. 9, the significant common-mode current ICM1 is created by Pri_SW and Cps. As illustrated in FIGS. 6-7, the voltage waveform Pri_Sw and Sec1_SW have similar shapes but different amplitudes (due to the turns ratio of transformer T1). Thus, the common-mode current ICM1 can be offset by another common mode current (i.e., common mode compensation current) ICM2 that has a substantially equal amplitude flowing in the opposite direction. To achieve this, a compensation capacitor, Ccm, can be added to the circuit from Sec1_SW (the synchronous rectifier switch switching node) to the primary input voltage node (Vin). Common mode compensation capacitor Ccm thus creates a common mode compensation current ICM2 to counterbalance common mode noise current ICM1. When ICM2 equals ICM1, there is no net common mode current flowing into RLISN. Thus, common mode noise from the LLC resonant converter can be substantially cancelled. The below equation shows the condition satisfying ICM1=ICM2.

$$\mathrm{Pri\_SW} \cdot Cps = \mathrm{Sec1\_SW} \cdot Ccm$$

In other words, the size (capacitance value) of common mode compensation capacitor Ccm can be selected so that the product of this capacitance and the magnitude of the synchronous rectifier voltage (e.g., twice the output voltage) is equal to the magnitude of the primary voltage (i.e., DC bus voltage) times the parasitic capacitance of the transformer (Cps). Additionally, because the ratio of the voltage Pri_SW to the voltage Sec1_SW is determined by the turn ratio of the transformer (Np/Ns), the capacitance value of the common mode noise compensation capacitor can be determined by multiplying the turns ratio of the transformer times the parasitic capacitance of the transformer.

Figure 11:
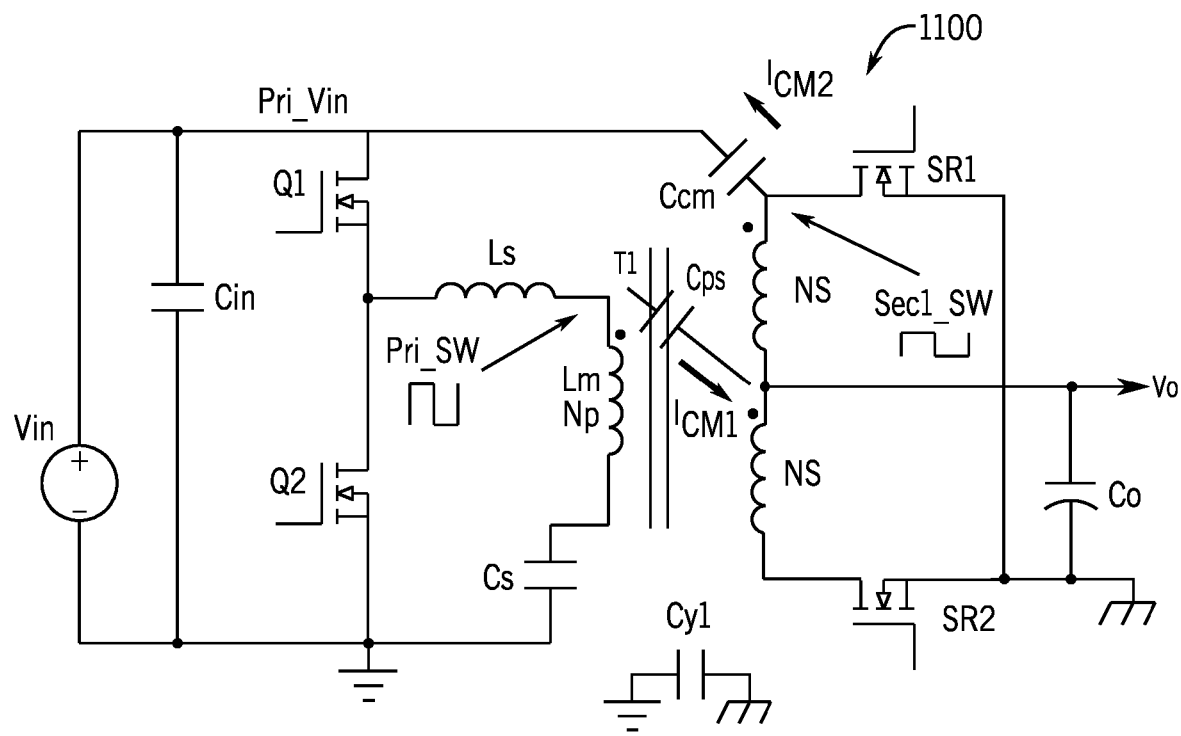
FIG. 11 illustrates a circuit implementation of an LLC resonant converter power supply with common mode noise compensation.
Figure 12:
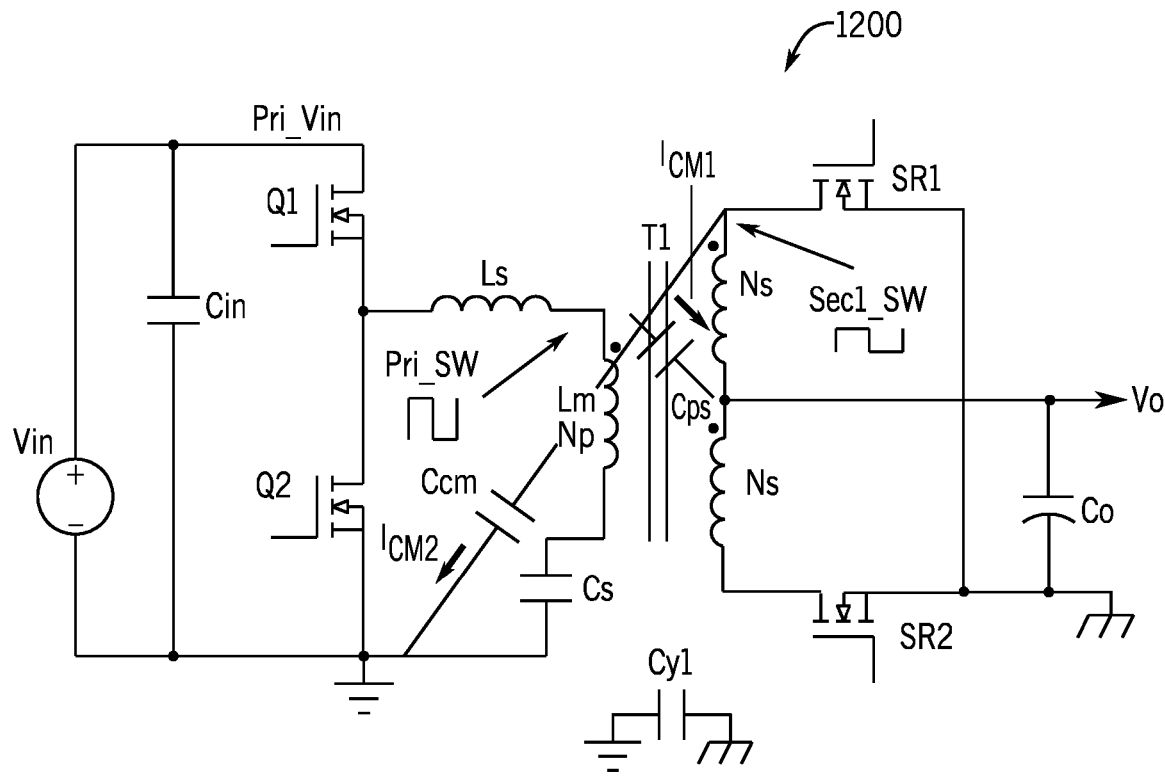
FIG. 12 illustrates an alternative circuit implementation of an LLC resonant converter power supply with common mode noise compensation.

FIGS. 11 and 12 illustrate a circuit implementation of an LLC resonant converter power supply 1100 with common mode noise compensation Ccm based on the model of FIG. 10. One terminal of common mode compensation capacitor Ccm can be connected to Sec1_SW node (i.e., synchronous rectifier switching node). The other terminal of common mode compensation capacitor Ccm can be connected to either the primary input voltage (as illustrated in FIG. 11) or the primary ground node (as illustrated in FIG. 12). Both connections are theoretically equivalent when the input capacitance Cin is sufficiently large or low impedance. The capacitance value of common mode noise compensation capacitor Ccm can be selected (i.e., tuned) using the relationship described above to achieve the minimum common mode current. As illustrated in both FIGS. 11 and 12, the common mode noise current ICM1 flows in a direction opposite common mode noise compensation current ICM2, thus allowing for substantially complete common mode noise cancellation provided that the currents are substantially equal.

Figure 13:
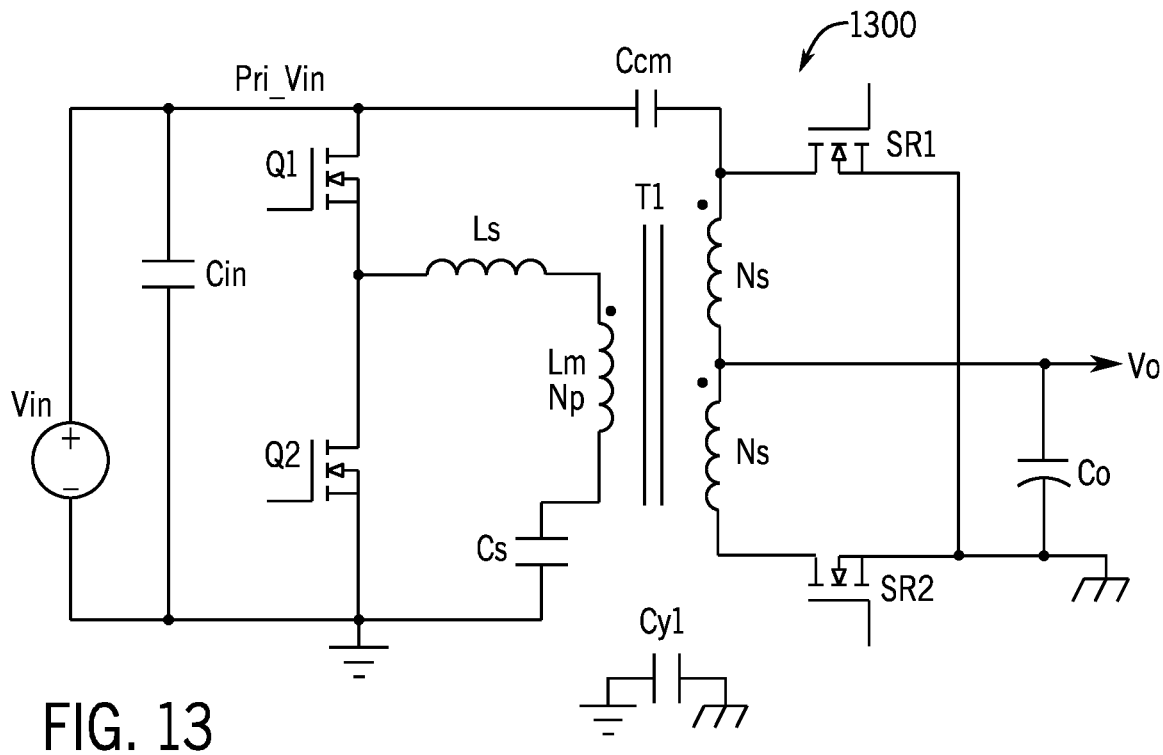
FIG. 13 illustrates an LLC resonant converter with a common mode noise compensation capacitor.
Figure 14:
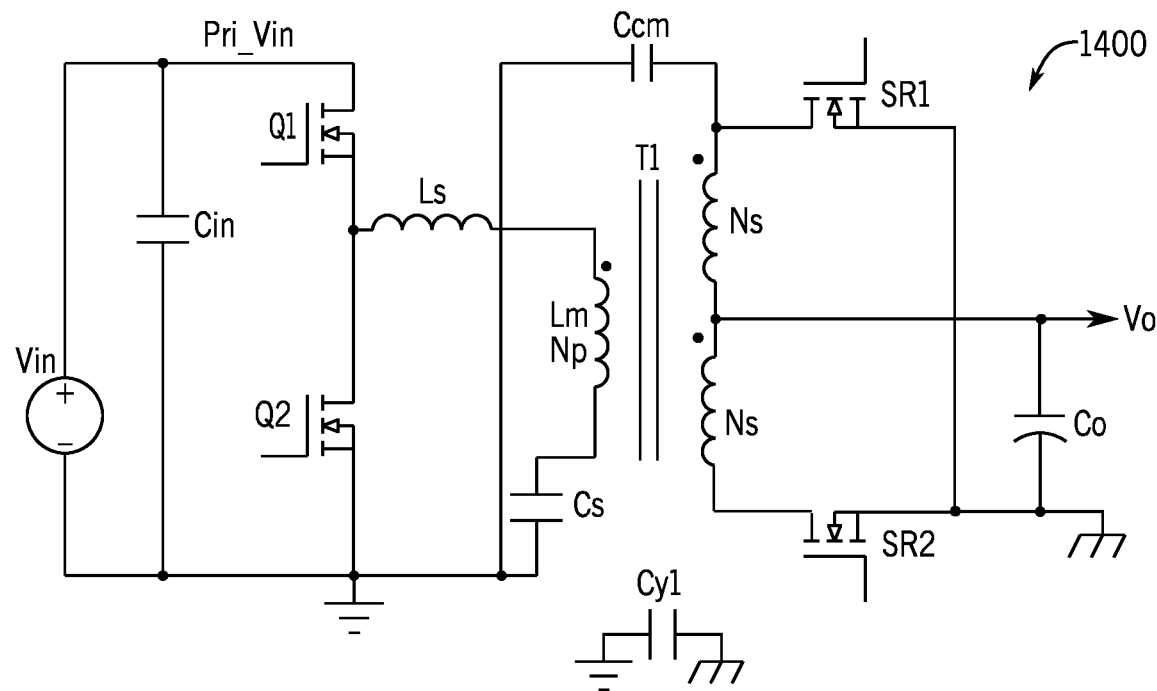
FIG. 14 illustrates an alternative LLC resonant converter with an alternative common mode noise compensation capacitor.
Figure 15:
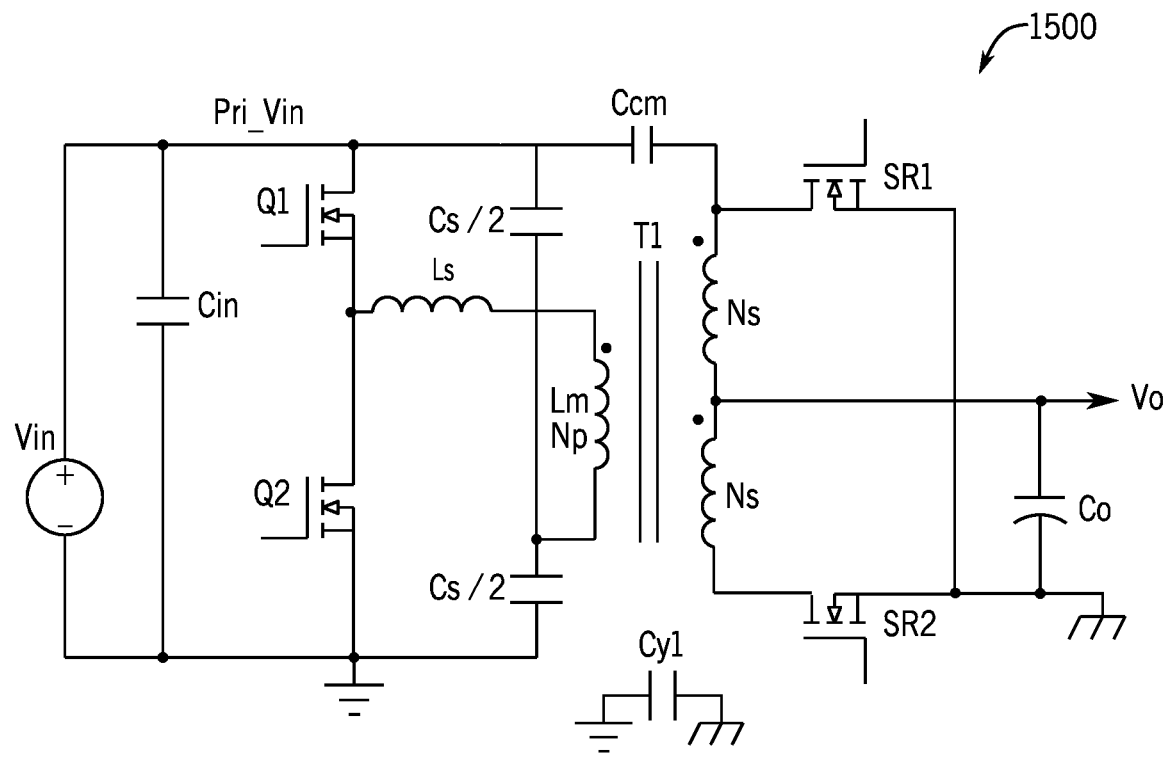
FIG. 15 illustrates an LLC resonant converter with a split resonant capacitor and a common mode noise compensation capacitor.
Figure 16:
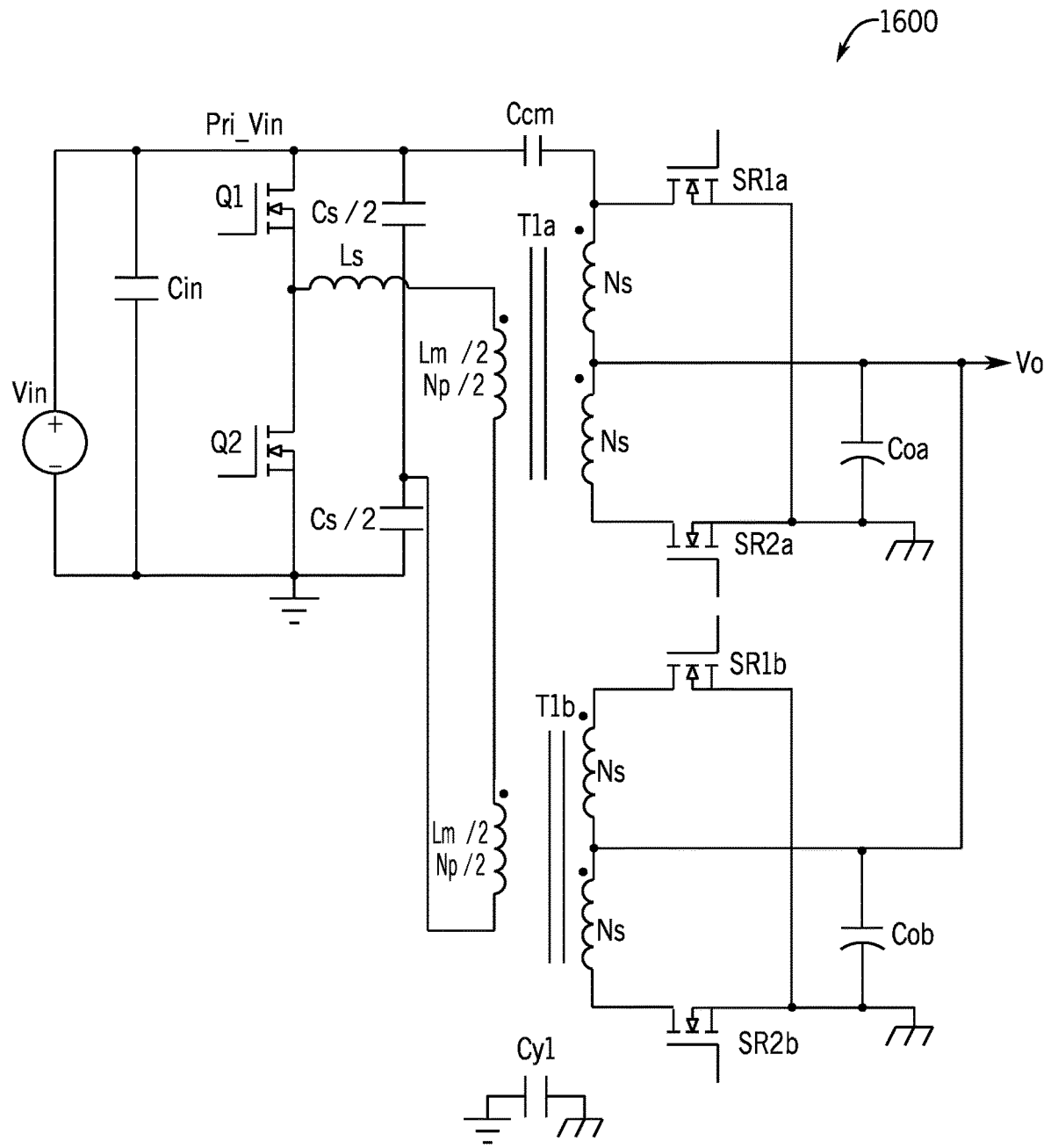
FIG. 16 illustrates a two-transformer resonant LLC converter with a common mode noise compensation capacitor.

FIG. 13 illustrates an LLC resonant converter 1300 with a common mode noise compensation capacitor Ccm connected as described with respect to FIG. 11. Similarly, FIG. 14 illustrates an alternative LLC resonant converter 1400 with an alternative common mode noise compensation capacitor Ccm connected as described with respect to FIG. 12. In both cases, the arrangement shows only the physical components in a more conventional schematic depiction. FIG. 15 illustrates an LLC resonant converter 1500 with split resonant capacitors Cs/2 and a common mode noise compensation capacitor Ccm connected substantially as described with respect to FIG. 11. Finally, FIG. 16 illustrates a two-transformer resonant LLC converter 1600 with a common mode noise compensation capacitor Ccm connected substantially as described with respect to FIG. 11. For the embodiments of FIG. 15 or 16, the common mode compensation capacitor could also be connected to the primary ground node, as illustrated in FIG. 12.

The cancellation techniques described herein may become less effective as switching frequency increases. This is at least in part because of parasitic ringing on the secondary side of transformer T1. To compensate for this effect, the capacitance value of capacitor Cy1 (coupled between the primary ground and the secondary ground) may be decreased, thereby improving high-frequency performance.

The foregoing describes exemplary embodiments of LLC resonant converter power supplies incorporating common mode noise compensation. Such configurations may be used in a variety of applications but may be particularly advantageous when used in conjunction with computer power supplies, including but not limited to computers with relatively higher power consumption, such as desktop computers, workstations, servers, and the like. Although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:

1. A power converter comprising:
   a switching bridge having two input terminals configured to receive an input voltage and a switch node coupled to a primary winding of a transformer;
   at least one rectifier device coupled between a secondary winding of the transformer and an output of the power converter; and
   a common mode noise compensation capacitor, a first terminal of the common mode noise compensation capacitor being coupled to a connection between the secondary winding of the transformer and the at least one rectifier device, and a second terminal of the common mode noise compensation capacitor being coupled to an energized input terminal of the two input terminals.

2. The power converter of claim 1 wherein a capacitance of the common mode noise compensation capacitor is selected to be equal to a turns ratio of the transformer times a parasitic capacitance of the transformer.

3. The power converter of claim 1 wherein the power converter is an LLC resonant converter and further comprises a resonant capacitor coupled to the primary winding of the transformer.

4. The power converter of claim 3 wherein the resonant capacitor is coupled in series with the primary winding.

5. The power converter of claim 1 further comprising a capacitor coupled between an input ground and an output ground of the power converter.

6. A power supply comprising:
   an input power factor correction stage configured to receive an AC input voltage and produce an intermediate DC bus voltage; and
   a DC-DC conversion stage configured to receive the intermediate DC bus voltage and produce a DC output voltage, wherein the DC-DC conversion stage further comprises:
      a switching bridge having two input terminals configured to receive an input voltage and a switch node coupled to a primary winding of a transformer;
      at least one rectifier device coupled between a secondary winding of the transformer and an output of the DC-DC conversion stage; and
      a common mode noise compensation capacitor, a first terminal of the common mode noise compensation capacitor being coupled to a connection between the secondary winding of the transformer and the at least one rectifier device, and a second terminal of the common mode noise compensation capacitor being coupled to an energized input terminal of the two input terminals.

7. The power supply of claim 6 wherein a capacitance of the common mode noise compensation capacitor is selected to be equal to the turns ratio of a transformer times a parasitic capacitance of the transformer.

8. The power supply of claim 6 wherein the DC-DC conversion stage is an LLC resonant converter and further comprises a resonant capacitor coupled to the primary winding of the transformer.

9. The power supply of claim 6 further comprising a capacitor coupled between an input ground and an output ground of the DC-DC conversion stage.

10. A power supply comprising:
    an input power factor correction stage configured to receive an AC input voltage and produce a DC an intermediate DC bus voltage; and
    a DC-DC conversion stage having first and second input terminals that receive the intermediate DC bus voltage and one or more switching devices operable to produce a DC output voltage, the DC-DC conversion stage further comprising:
       a transformer having a primary winding and a secondary winding; and
       a common mode noise compensation capacitor, a first terminal of the common mode noise compensation capacitor being coupled to the secondary winding of the transformer, and a second terminal of the common mode noise compensation capacitor being coupled to an energized input terminal of the first or second input terminals.

11. The power supply of claim 10, wherein the input power factor correction stage further comprises:
    a rectifier;
    one or more common mode choke coils coupled between the AC input voltage and the rectifier;
    one or more filter capacitors coupled across the AC input voltage; and
    a boost converter coupled to an output of the rectifier and operable to provide the intermediate DC bus voltage.

12. The power supply of claim 10 wherein a capacitance of the common mode noise compensation capacitor is selected to be equal to a turns ratio of the transformer times a parasitic capacitance of the transformer.

13. The power supply of claim 10 wherein the DC-DC conversion stage is an LLC resonant converter and further comprises a resonant capacitor coupled in series with the primary winding of the transformer.

14. The power supply of claim 10 further comprising a capacitor coupled between an input ground and an output ground of the DC-DC conversion stage.

15. A power converter comprising:
    a switching bridge having two input terminals configured to receive an input voltage and a switch node coupled to a primary winding of a transformer;
    at least one rectifier device coupled between a secondary winding of the transformer and an output of the power converter; and
    a common mode noise compensation capacitor, a first terminal of the common mode noise compensation capacitor being coupled to a connection between the secondary winding of the transformer and the at least one rectifier device, and a second terminal of the common mode noise compensation capacitor being coupled to one of the two input terminals;
    wherein a capacitance of the common mode noise compensation capacitor is selected to be equal to a turns ratio of the transformer times a parasitic capacitance of the transformer.

16. The power converter of claim 15 wherein the common mode noise compensation capacitor is coupled to an energized input terminal.

17. The power converter of claim 15 wherein the common mode noise compensation capacitor is coupled to a grounded input terminal.

18. The power converter of claim 15 wherein the power converter is an LLC resonant converter and further comprises a resonant capacitor coupled to the primary winding of the transformer.

19. The power converter of claim 18 wherein the resonant capacitor is coupled in series with the primary winding.

20. The power converter of claim 15 further comprising a capacitor coupled between an input ground and an output ground of the power converter.

21. A power supply comprising:
an input power factor correction stage configured to receive an AC input voltage and produce an intermediate DC bus voltage; and
a DC-DC conversion stage configured to receive the intermediate DC bus voltage and produce a DC output voltage, wherein the DC-DC conversion stage further comprises:
a switching bridge having two input terminals configured to receive an input voltage and a switch node coupled to a primary winding of a transformer;
at least one rectifier device coupled between a secondary winding of the transformer and an output of the DC-DC conversion stage; and
a common mode noise compensation capacitor, a first terminal of the common mode noise compensation capacitor being coupled to a connection between the secondary winding of the transformer and the at least one rectifier device, and a second terminal of the common mode noise compensation capacitor being coupled to one of the two input terminals;
wherein a capacitance of the common mode noise compensation capacitor is selected to be equal to the turns ratio of a transformer times a parasitic capacitance of the transformer.

22. The power supply of claim 21 wherein the common mode noise compensation capacitor is coupled to an energized input terminal.

23. The power supply of claim 21 wherein the common mode noise compensation capacitor is coupled to a grounded input terminal.

24. The power supply of claim 21 wherein the DC-DC conversion stage is an LLC resonant converter and further comprises a resonant capacitor coupled to the primary winding of the transformer.

25. The power supply of claim 21 further comprising a capacitor coupled between an input ground and an output ground of the DC-DC conversion stage.

26. A power supply comprising:
an input power factor correction stage configured to receive an AC input voltage and produce a DC an intermediate DC bus voltage; and
a DC-DC conversion stage having first and second input terminals that receive the intermediate DC bus voltage and one or more switching devices operable to produce a DC output voltage, the DC-DC conversion stage further comprising:
a transformer having a primary winding and a secondary winding; and
a common mode noise compensation capacitor, a first terminal of the common mode noise compensation capacitor being coupled to the secondary winding of the transformer, and a second terminal of the common mode noise compensation capacitor being coupled to one of the first or second input terminals;
wherein a capacitance of the common mode noise compensation capacitor is selected to be equal to the turns ratio of a transformer times a parasitic capacitance of the transformer.

27. The power supply of claim 26, wherein the input power factor correction stage further comprises:
a rectifier;
one or more common mode choke coils coupled between the AC input voltage and a rectifier;
one or more filter capacitors coupled across the AC input voltage; and
a boost converter coupled to an output of the rectifier and operable to provide the intermediate DC bus voltage.

28. The power supply of claim 26 wherein the common mode noise compensation capacitor is coupled to an energized input terminal.

29. The power supply of claim 26 wherein the common mode noise compensation capacitor is coupled to a grounded input terminal.

30. The power supply of claim 26 wherein the DC-DC conversion stage is an LLC resonant converter and further comprises a resonant capacitor coupled in series with the primary winding of the transformer.

31. The power supply of claim 26 further comprising a capacitor coupled between an input ground and an output ground of the DC-DC conversion stage.

* * * * *